US009734903B2

(12) United States Patent
Zamir et al.

(10) Patent No.: US 9,734,903 B2
(45) Date of Patent: Aug. 15, 2017

(54) DISTURB CONDITION DETECTION FOR A RESISTIVE RANDOM ACCESS MEMORY

(71) Applicant: SANDISK TECHNOLOGIES INC., Plano, TX (US)

(72) Inventors: Ran Zamir, Ramat Gan (IL); Eran Sharon, Rishon Lezion (IL); Idan Alrod, Herzliya (IL); Ariel Navon, Revava (IL); Tz-Yi Liu, Palo Alto, CA (US); Tianhong Yan, Saratoga, CA (US)

(73) Assignee: SanDisk Technologies LLC, Plano, TX (US)

( * ) Notice: Subject to any disclaimer, the term of this patent is extended or adjusted under 35 U.S.C. 154(b) by 355 days.

(21) Appl. No.: 14/538,172

(22) Filed: Nov. 11, 2014

(65) Prior Publication Data

US 2016/0133322 A1     May 12, 2016

(51) Int. Cl.
| | |
|---|---|
| *G11C 16/00* | (2006.01) |
| *G11C 13/00* | (2006.01) |
| *G06F 7/58* | (2006.01) |
| *G11C 16/34* | (2006.01) |

(52) U.S. Cl.
CPC .......... *G11C 13/0033* (2013.01); *G06F 7/582* (2013.01); *G11C 13/003* (2013.01); *G11C 13/004* (2013.01); *G11C 13/0069* (2013.01); *G11C 16/3427* (2013.01); *G11C 16/3431* (2013.01); *G11C 2213/71* (2013.01); *G11C 2213/77* (2013.01); *G11C 2213/78* (2013.01); *G11C 2213/79* (2013.01)

(58) Field of Classification Search
CPC ............ G11C 16/3431; G11C 16/3427; G11C 13/0033
USPC ................... 365/148, 201, 222, 206, 185.02
See application file for complete search history.

(56) References Cited

U.S. PATENT DOCUMENTS

| | | | |
|---|---|---|---|
| 7,196,928 B2 | 3/2007 | Chen | |
| 7,808,831 B2 | 10/2010 | Mokhlesi et al. | |
| 8,699,262 B2 | 4/2014 | Watanabe et al. | |
| 2006/0039196 A1* | 2/2006 | Gorobets | G06F 11/106 365/185.01 |
| 2009/0010039 A1 | 1/2009 | Tokiwa et al. | |
| 2009/0323412 A1 | 12/2009 | Mokhlesi et al. | |
| 2013/0229846 A1* | 9/2013 | Chien | H01L 27/2454 365/51 |
| 2014/0056065 A1 | 2/2014 | Dong et al. | |

* cited by examiner

*Primary Examiner* — Huan Hoang
*Assistant Examiner* — Jay Radke
(74) *Attorney, Agent, or Firm* — Toler Law Group, PC (57) ABSTRACT

A data storage device includes a memory die. The memory die includes a resistive random access memory (ReRAM) having a first portion and a second portion that is adjacent to the first portion. A method includes determining whether to access the second portion of the ReRAM in response to initiating a first operation targeting the first portion of the ReRAM. The method further includes initiating a second operation that senses information stored at the second portion to generate sensed information in response to determining to access the second portion. The method further includes initiating a third operation to rewrite the information at the ReRAM in response to detecting an indication of a disturb condition based on the sensed information.

20 Claims, 4 Drawing Sheets

DISTURB CONDITION DETECTION FOR A RESISTIVE RANDOM ACCESS MEMORY

FIELD OF THE DISCLOSURE

The present disclosure is generally related to data storage devices and more particularly to disturb condition detection at data storage devices.

BACKGROUND

Non-volatile data storage devices have enabled increased portability of data and software applications. For example, multi-level cell (MLC) storage elements of a memory device may each store multiple bits of data, enhancing data storage density as compared to single-level cell (SLC) memory devices. As another example, a memory with a three-dimensional (3D) memory configuration may include multiple layers of storage elements, thus increasing data storage density compared to a two-dimensional (2D) (or "planar") memory device. Consequently, memory devices enable users to store and access a large amount of data.

As data storage density increases, error rates of stored data may also increase (e.g., due to noise and other factors). A data storage device may encode and decode data using an error correcting code (ECC) technique. The ECC technique may enable error correction. In some cases, data stored at the data storage device may include a large number of errors (e.g., due to noise or other factors). In this case, an error rate of data may exceed an error correction capability associated with the particular ECC scheme used by the data storage device, which may result in data loss.

SUMMARY

A data storage device includes a memory die. The memory die may include a resistive random access memory (ReRAM), such as a ReRAM having a three-dimensional (3D) memory configuration. Disturb conditions at the ReRAM may be checked probabilistically in response to operations at the ReRAM. For example, an operation (e.g., a read operation or a write operation) may target a first portion of the ReRAM. The first portion may include a storage element corresponding to a particular bit line and a particular word line.

In response to the operation, the data storage device may determine, based on a particular probability, whether to check for a disturb condition at a second portion of the ReRAM that is adjacent to the first portion. To illustrate, the probability may correspond to 0.01, such that the probability of checking for the disturb condition is approximately one percent. If the data storage device determines that the disturb condition is to be checked (e.g., if a pseudo-randomly generated number satisfies a threshold), the data storage device may access one or more unselected adjacent (or "neighbor") storage elements, such as one or more storage elements of the particular bit line or the particular word line that are not targeted by the operation. If one or more sensed values accessed from the second portion indicate a disturb condition (e.g., due to being outside a target range or distribution), the data storage device may initiate an operation to rewrite information at the second portion of the memory.

DETAILED DESCRIPTION

Figure 1:
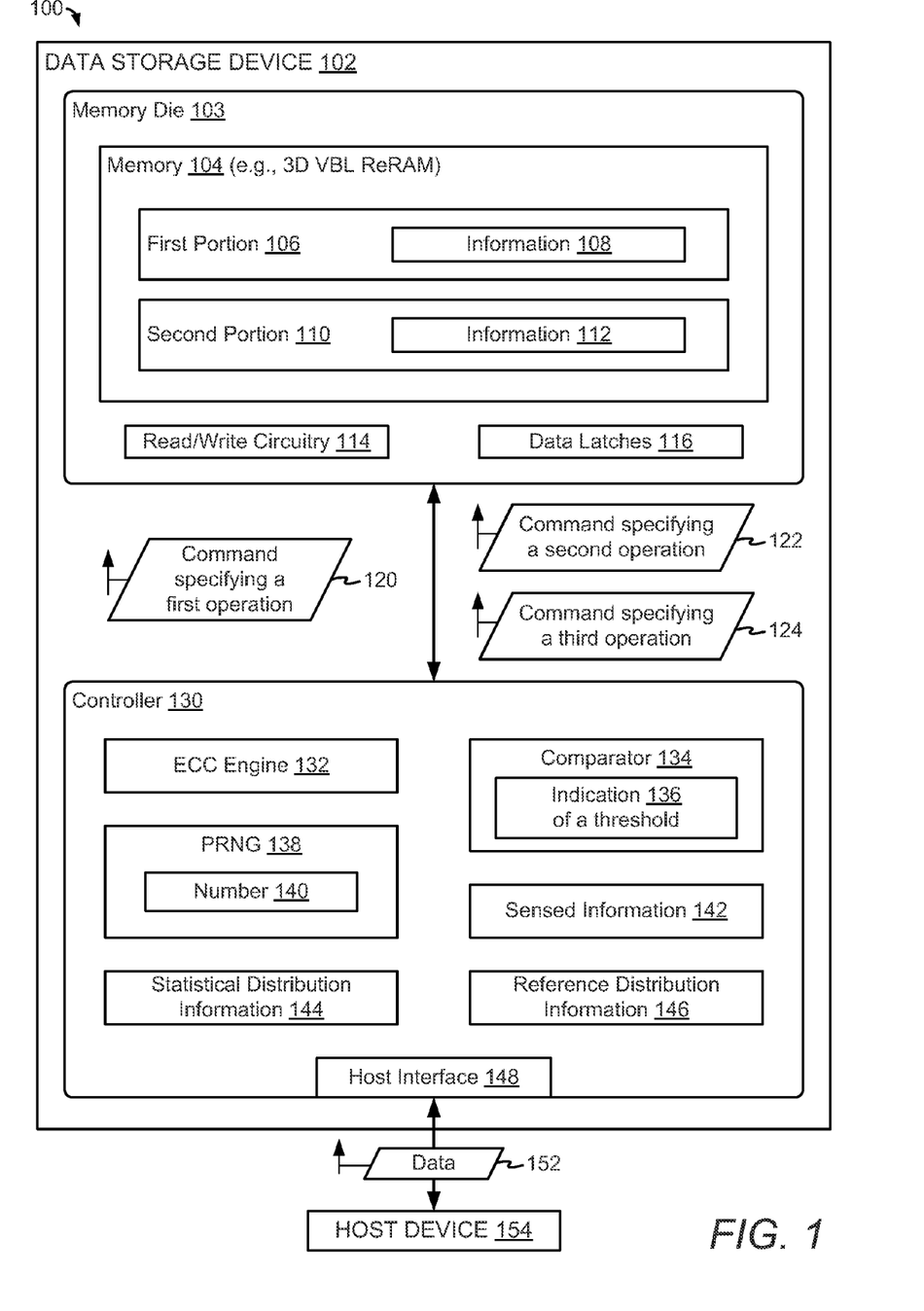
FIG. 1 is a block diagram of a particular illustrative embodiment of a system that includes a data storage device configured to detect disturb conditions at a memory of the data storage device.

Referring to FIG. 1, an illustrative example of a system is depicted and generally designated 100. The system 100 includes a data storage device 102 and a host device 154. The data storage device 102 and the host device 154 may be operationally coupled via a connection, such as a bus or a wireless connection. The data storage device 102 may be embedded within the host device 154, such as in accordance with a Joint Electron Devices Engineering Council (JEDEC) Solid State Technology Association Universal Flash Storage (UFS) configuration. Alternatively, the data storage device 102 may be removable from the host device 154 (i.e., "removably" coupled to the host device 154). As an example, the data storage device 102 may be removably coupled to the host device 154 in accordance with a removable universal serial bus (USB) configuration.

The data storage device 102 includes a memory die 103 and a controller 130. The memory die 103 and the controller 130 may be coupled via one or more buses, one or more interfaces, and/or another structure. An interface may be wired (e.g., a bus structure) or wireless (e.g., a wireless communication interface).

The memory die 103 includes a memory 104, such as a non-volatile memory. For example, the memory 104 may include a resistive random access memory (ReRAM). The memory 104 may have a three-dimensional (3D) memory configuration, such as a vertical bit line (VBL) 3D architecture. For example, the memory 104 may include a 3D VBL ReRAM. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a stacked 2D memory configuration.

The memory 104 may include storage elements (e.g., memory cells) and a plurality of bit lines and word lines connecting the storage elements. In FIG. 1, the memory 104 includes a first portion 106 and second portion 110. The second portion 110 may be adjacent to the first portion 106. For example, the first portion 106 may include a first set of one or more storage elements associated with a first word line and a first bit line. In this example, the second portion 110 may include a second set of one or more storage elements associated with either the first word line and a second bit line or a second word line and the first bit line. The memory 104 may further include read/write circuitry 114 and data latches 116.

The controller 130 may include an error correcting code (ECC) engine 132. The controller 130 may further include a comparator 134, a pseudo-random number generator (PRNG) 138, and a host interface 148.

The ECC engine 132 is configured to receive data and to generate one or more ECC codewords based on the data. The ECC engine 132 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof.

The ECC engine 132 is configured to decode data accessed from the memory 104. For example, the ECC engine 132 may be configured to decode data accessed from the memory 104 to detect and correct one or more errors that may be present in the data, up to an error correcting capacity of the particular ECC scheme. The ECC engine 132 may include a Hamming decoder, an RS decoder, a BCH decoder, an LDPC decoder, a turbo decoder, a decoder configured to decode data according to one or more other ECC schemes, or a combination thereof.

The controller 130 is configured to receive data and instructions from the host device 154 and to send data to the host device 154. For example, the controller 130 may receive data from the host device 154 via the host interface 148 and may send data to the host device 154 via the host interface 148.

The controller 130 is configured to send data and commands to the memory 104 and to receive data from the memory 104. For example, the controller 130 is configured to send data and a write command to cause the memory 104 to store the data to a specified address of the memory 104. The write command may specify a physical address of a portion of the memory 104 (e.g., a physical address of a word line of the memory 104) that is to store the data. The controller 130 is configured to send a read command to the memory 104 to access data from a specified address of the memory 104. The read command may specify the physical address of a portion of the memory 104 (e.g., a physical address of a word line of the memory 104).

The host device 154 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The host device 154 may communicate via a host controller, which may enable the host device 154 to communicate with the data storage device 102. The host device 154 may operate in compliance with a JEDEC Solid State Technology Association industry specification, such as an embedded MultiMedia Card (eMMC) specification or a Universal Flash Storage (UFS) Host Controller Interface specification. The host device 154 may operate in compliance with one or more other specifications, such as a Secure Digital (SD) Host Controller specification as an illustrative example. Alternatively, the host device 154 may communicate with the data storage device 102 in accordance with another communication protocol.

During operation, the controller 130 may receive data 152 and a request for write access to the memory 104 from the host device 154 via the host interface 148. The data 152 may correspond to a data file (e.g., an image file, an audio file, or a video file, as illustrative examples). The controller 130 may provide the data 152 to the ECC engine 132 to generate one or more ECC codewords based on the data 152. The controller 130 may initiate one or more operations to write the one or more ECC codewords to the memory 104. For example, the one or more ECC codewords may correspond to information 108 (e.g., a first ECC codeword) and/or information 112 (e.g., a second ECC codeword).

The controller 130 may initiate a first operation targeting the first portion 106. The first operation may be a memory operation, such as a programming operation to program the information 108 to the first portion 106 or a sense operation to sense the information 108 from the first portion 106. To initiate the first operation, the controller 130 may issue a command 120 to the memory die 103. The command 120 may specify a physical address of the first portion 106 and an opcode (e.g., a programming opcode or a sense opcode).

In response to initiating the first operation targeting the first portion 106 (e.g., during the first operation or following the first operation), the controller 130 may determine whether to access another portion of the memory 104, such as a portion of the memory 104 that is adjacent to the first portion 106. For example, the second portion 110 may be adjacent to the first portion 106.

In an illustrative implementation, the PRNG 138 is configured to generate a number 140 in response to the controller 130 initiating the first operation. The number 140 may be generated based on a probability p, where $0<p<1$. As an illustrative example, if the probability is equal to 0.01, then the number 140 may have a one percent probability of being equal to a certain value (e.g., a one value).

The comparator 134 may be configured to determine whether the number 140 satisfies a threshold (e.g., is greater than or equal to the threshold). For example, the comparator 134 may store or access an indication 136 of the threshold. The comparator 134 may be configured to compare the number 140 to the indication 136 to determine whether the number 140 satisfies the threshold. In an illustrative implementation, the threshold corresponds to a one value, and the comparator is configured to determine whether the number 140 is equal to one.

To further illustrate, the controller 130 may determine whether to access the second portion 110 to perform a second operation, such as a disturb condition detection operation. If the first portion 106 is accessed a positive integer number n times, a probability of performing a disturb condition detection operation at the second portion 110 may be based on n and p. For example, if n=1,000 and p=0.01, then the probability of performing a disturb condition detection operation at the second portion 110 may be approximately $1-(1-p)^n \approx 0.99996$. The probability of misdetection of a disturb condition at the second portion 110 is less than $(1-p)^n \approx 4.3e-5$, as this number represents the probability that in 1,000 access operations to the first portion 106 of the memory 104 no disturb condition detection operation was initiated at the second portion 110 of the memory 104, but in addition there is a (e.g., small) probability that even though no detection operation was initiated, the second portion 110 did not suffer from a disturb condition.

If the number 140 fails to satisfy the threshold (e.g., the number is less than the threshold), the controller 130 may determine not to access another portion of the memory 104 in response to the first operation. In this case, the controller 130 may initiate one or more other tasks upon completion of the first operation (e.g., by initiating one or more additional operations, such as programming operations and/or sense operations at the memory 104), or the controller 130 may initiate a low-power or standby mode of operation (e.g., if no other operations are to be performed).

If the number 140 satisfies the threshold, the controller 130 may identify a portion of the memory 104 that is adjacent to the first portion 106. For example, if the number 140 satisfies the threshold, the controller 130 may adjust (e.g., increment or decrement) an index of a word line associated with the first portion 106. As another example, if the number 140 satisfies the threshold, the controller 130 may increment (or decrement) an index of a bit line associated with the first portion 106. Incrementing (or decrementing) the index of the word line or bit line may generate an index of a word line or a bit line associated with a portion of the memory 104, such as the second portion 110, that is adjacent to the first portion 106.

The probability p may be based on whether a word line index or a bit line index is to be adjusted. For example, depending on the particular application, disturb effects may be more pronounced for adjacent word lines than for adjacent bit lines (e.g., if a bit line-to-bit line distance is greater than a word line-to-word line distance). In this example, the probability p may be greater if a word line index is to be adjusted than if a bit line index is to be adjusted (because adjacent word lines may be more likely to be disturbed than adjacent bit lines). In other cases, adjacent bit lines may be more subject to disturb effects than adjacent word lines, and the probability p may be greater if a bit line index is to be adjusted than if a word line index is to be adjusted. The controller 130 may adjust a value of the probability p, such as by adjusting or selecting a value of the threshold associated with the indication 136, at least partially based on whether a word line index or a bit line index is to be adjusted.

After identifying the second portion 110, the controller 130 may initiate a second operation to access the second portion 110, such as by sensing the information 112 stored at the second portion 110. For example, the controller 130 may issue a command 122 to the memory die 103, and the command 122 may indicate a sense opcode and a physical address of the second portion 110.

The memory die 103 may receive the command 122 and may sense the information 112 in response to receiving the command 122. Sensing the information 112 may generate sensed information 142. In a particular embodiment, the read/write circuitry 114 is configured to access the second portion 110 using a soft read technique. In this example, the sensed information 142 may include one or more soft bits. Alternatively or in addition, the read/write circuitry 114 may access the second portion 110 using a hard read technique. In this case, the sensed information 142 may include one or more hard bits. In certain implementations, the sensed information 142 may include a full ECC codeword. In other examples, the sensed information 142 may include one or more "sample" values (e.g., a subset) that may represent an ECC codeword of the information 112.

The memory die 103 may provide the sensed information 142 to the controller 130. The controller 130 may store the sensed information 142, such as at a random access memory (RAM) of the controller 130 (not shown in FIG. 1).

The controller 130 may be configured to detect a disturb condition at the second portion 110 using the sensed information 142. To illustrate, the controller 130 may analyze one or more soft bits of the sensed information 142 to determine whether (or how much) the one or more soft bits deviate from a target value or target range. If one or more soft bits of the sensed information 142 deviate from the target value or target range by more than a threshold amount, a disturb condition may exist at the second portion 110. For example, the disturb condition may include one or more of a program disturb effect caused by a programming operation to program the information 108 to the first portion 106 or a read disturb effect caused by a read operation to read the information 108.

Alternatively or in addition, the controller 130 may initiate a decoding operation using the sensed information 142 to detect a disturb condition associated with the second portion 110. To illustrate, the sensed information 142 may include an ECC codeword that can be input to the ECC engine 132 for decoding. In this example, the ECC engine 132 may count a number of errors detected (and/or corrected) during decoding of the sensed information 142. If the number of errors satisfies an error threshold, a disturb condition may exist at the second portion 110.

Alternatively or in addition, the controller 130 may be configured to determine statistical distribution information 144 based on the sensed information 142. The statistical distribution information 144 may indicate a histogram of states associated with storage elements of the second portion 110, as an illustrative example. In this example, the histogram indicated by the statistical distribution information 144 may indicate one or more Gaussian distributions of states, such as a first Gaussian distribution corresponding to logical "0" states and a second Gaussian distribution corresponding to logical "1" states.

The controller 130 may be configured to detect a disturb condition by comparing the statistical distribution information 144 to reference distribution information 146. For example, the controller 130 may be configured to compare a height associated with the statistical distribution information 144 to a reference height associated with the reference distribution information 146. As another example, the controller 130 may be configured to compare a width associated with the statistical distribution information 144 to a reference width associated with the reference distribution information 146. If the height exceeds the reference height by a threshold difference and/or if the width exceeds the reference width by a threshold difference, a disturb effect may exist at the second portion 110.

If the controller 130 fails to detect a disturb condition based on the sensed information 142, then the controller 130 may initiate one or more other tasks (e.g., by initiating one or more additional operations, such as programming operations and/or sense operations at the memory 104), or the controller 130 may initiate a low-power or standby mode of operation (e.g., if no other operations are to be performed).

If the controller 130 detects a disturb condition based on the sensed information 142, the controller 130 may initiate a third operation. The third operation may refresh (e.g., rewrite) the information 112. For example, the information 112 may be sensed from the memory 104 (based on the command 122 or another command). The information 112 may be decoded and re-encoded by the ECC engine 132 to generate refreshed information. The refreshed information may be rewritten to the memory 104 using a command 124 (e.g., a refresh command). In an illustrative implementation, the command 124 causes the memory die 103 to overwrite the information 112 with the refreshed information. In other implementations, the refreshed information may be written to another location of the memory 104, and the information 112 at the second portion 110 may be invalided (e.g., by updating a mapping table at the controller 130 to indicate that the information 112 at the second portion 110 is invalid).

Depending on the particular implementation, issuance of one or more of the commands 122, 124 may cause the controller 130 to generate one or more numbers at the PRNG 138 to determine whether to access another portion of the memory 104 that is adjacent to the second portion 110, such as to detect whether sensing and/or refreshing of the information 112 has disturbed another portion of the memory 104. In this case, the controller 130 may access another portion of the memory 104 that is adjacent to the second portion 110 (e.g., the first portion 106) to determine whether a disturb condition has occurred due to sensing and/or refreshing the information 112. In other implementations, operations initiated by the commands 122, 124 do not cause the controller 130 to check for disturb conditions. For example, in certain implementations, the controller 130 is configured to check for disturb conditions in response to read commands and write commands received from the host device 154 (but not in response to read operations and write operations that are performed to check for disturb conditions). In this example, the controller 130 may be configured to check for read disturb conditions in response to externally-initiated events (e.g., host read commands and host write commands from the host device 154) but not in response to internally-initiated events (e.g., compaction processes, file table updates, and processes to check for disturb conditions).

The example of FIG. 1 illustrates that disturb effects can be detected and corrected based on a probabilistic technique. The probabilistic technique may increase the likelihood of a disturb condition being detected (e.g., with a probability of approximately $1-(1-p)^n \approx 0.99996$ if $n=1,000$ and $p=0.01$) and corrected. Further, the probabilistic technique may not substantially affect performance at the data storage device 102. For example, if $p=0.01$, then approximately one out of one hundred memory access operations to the memory 104 is expected to result in checking for a disturb condition (e.g., by accessing the second portion 110 after an operation on the first portion 106 as in the illustrative example of FIG. 1). Thus, data quality may be improved at the data storage device 102 (e.g., by refreshing the information 112 in response to detecting a disturb condition without substantially impacting performance).

Figure 2:
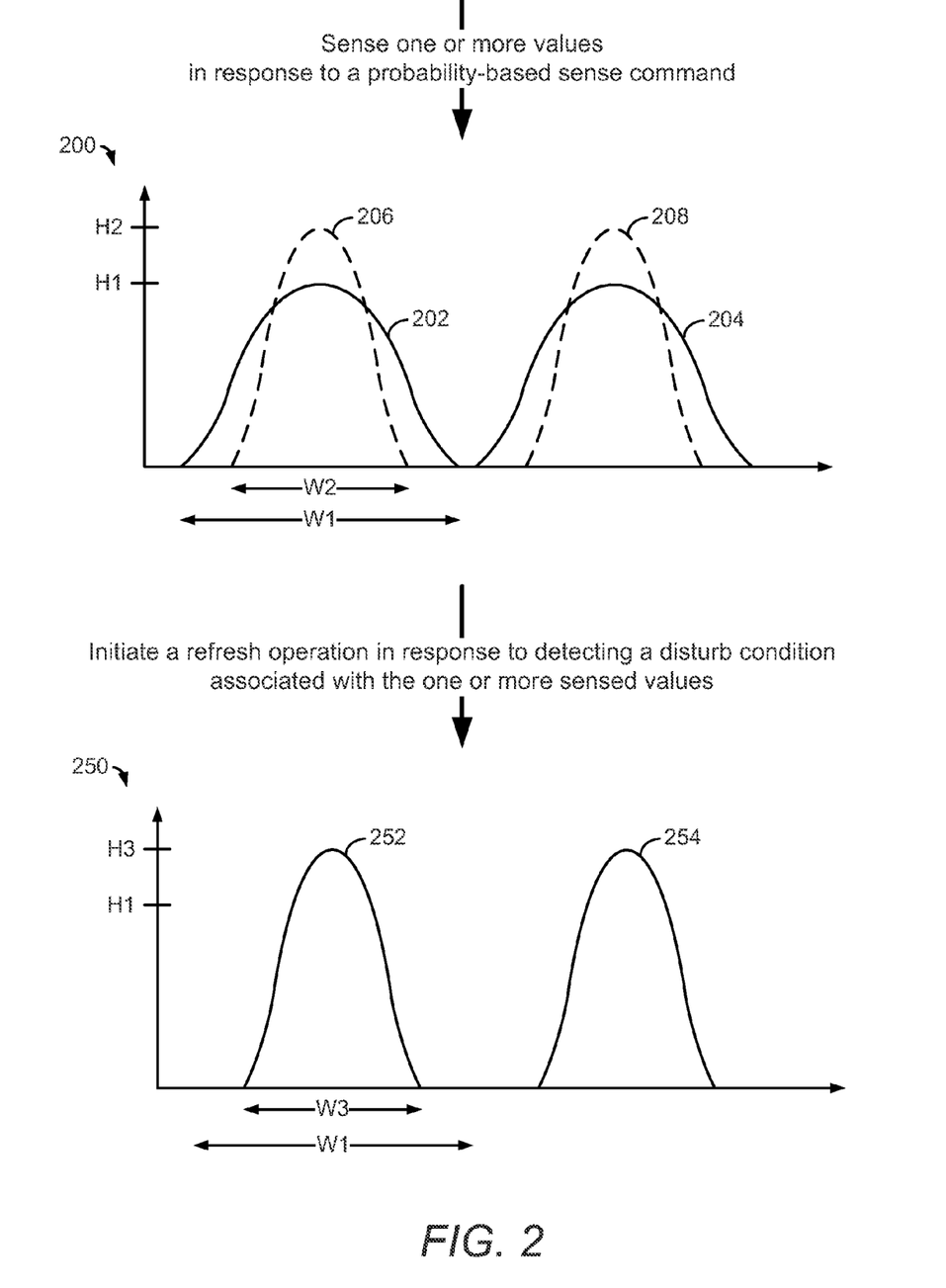
FIG. 2 is a diagram illustrating certain example operations of the data storage device of FIG. 1.

FIG. 2 depicts illustrative examples of a histogram 200 and a histogram 250. In FIG. 2, each horizontal axis (or abscissa) may indicate resistances, such as resistive states that can be programmed to one or more storage elements of the memory 104 of FIG. 1. Each vertical axis (or ordinate) may indicate a number of storage elements of the memory 104 of FIG. 1 programmed to the corresponding resistive state.

The histogram 200 indicates distributions 202, 204 (e.g., Gaussian distributions). The distributions 202, 204 may correspond to the statistical distribution information 144. The distribution 202 may indicate low-resistance states of storage elements of the second portion 110 (e.g., storage elements that each store a first value associated with the information 112, such as a logic "0" value). The distribution 204 may indicate high-resistance states of storage elements of the second portion 110 (e.g., storage elements that each store a second value associated with the information 112, such as a logic "1" value). Thus, the distributions 202, 204 may represent states of the second portion 110 of the memory 104 of FIG. 1 (i.e., the distributions 202, 204 may correspond to the information 112). In a particular embodiment, the distributions 202, 204 are measured using a soft read technique in response to a probability-based sense command, which may correspond to the command 122 of FIG. 1.

The histogram 200 further indicates reference distributions 206, 208 (e.g., Gaussian distributions). The reference distributions 206, 208 may correspond to the reference distribution information 146. For example, the reference distribution 206 may correspond to a reference low-resistance state distribution (or target range of low-resistance states that represent a first value programmed at the memory 104), and the reference distribution 208 may correspond to a reference high-resistance state distribution (or target range of high-resistance states that represent a second value programmed at the memory 104).

The histogram 200 indicates that the distributions 202, 204 deviate from the reference distributions 206, 208, which may indicate a disturb condition associated with the information 112 of FIG. 1. For example, a height H1 of the distribution 202 is less than a reference height H2 of the reference distribution 206. The controller 130 of FIG. 1 may be configured to determine a difference between the height H1 and the reference height H2. If the difference satisfies a threshold, the controller 130 may detect a disturb condition associated with the information 112. As another example, a width W1 (or a standard deviation or variance) of the distribution 202 is greater than a reference width W2 (or a standard deviation or variance) of the reference distribution 206. The controller 130 of FIG. 1 may be configured to determine a difference between the width W1 and the reference width W2. If the difference satisfies a threshold, the controller 130 may detect a disturb condition associated with the information 112. Alternatively or in addition, the controller 130 may compare heights and/or widths of the distribution 204 and the reference distribution 208.

In some cases, disturb effects at the memory 104 may "flatten" and "widen" the distributions 202, 204 as compared to the reference distributions 206, 208, which may result in data errors and/or data loss. For example, if a state associated with the distribution 202 is "pushed" into the distribution 204 due to a disturb effect, then the state may be sensed as a high-resistance state instead of a low-resistance state. As another example, if a state associated with the distribution 204 is "pushed" into the distribution 202 due to a disturb effect, then the state may be sensed as a low-resistance state instead of a high-resistance state. In some cases, a number of errors may exceed an error correction capability of the ECC engine 132, which may result in data loss.

If the controller 130 detects a disturb condition based on any of the distributions 202, 204, the controller 130 may initiate a refresh operation (e.g., by issuing the command 124 to the memory die 103). The refresh operation may include rewriting the information 112 at the second portion 110 of FIG. 1. For example, after rewriting the information 112 to the second portion 110, states of storage elements of the second portion 110 may correspond to distributions 252, 254 of the histogram 250. In the histogram 250, the distribution 252 has a height H3 that is greater than the height H1 of the distribution 202. The distribution 252 also has a width W3 that is less than the width W1 of the distribution 202. In addition, a height of the distribution 254 may be greater than a height of the distribution 204, and a width of the distribution 254 may be less than a width of the distribution 204.

The example of FIG. 2 illustrates that information can be reprogrammed in response to detecting a disturb condition. Reprogramming the information may avoid data loss caused by uncorrectable data errors (e.g., when a number of errors in an ECC codeword exceeds an error correction capability of the ECC engine 132). Thus, reliability of data stored at the data storage device 102 may be improved.

Figure 3:
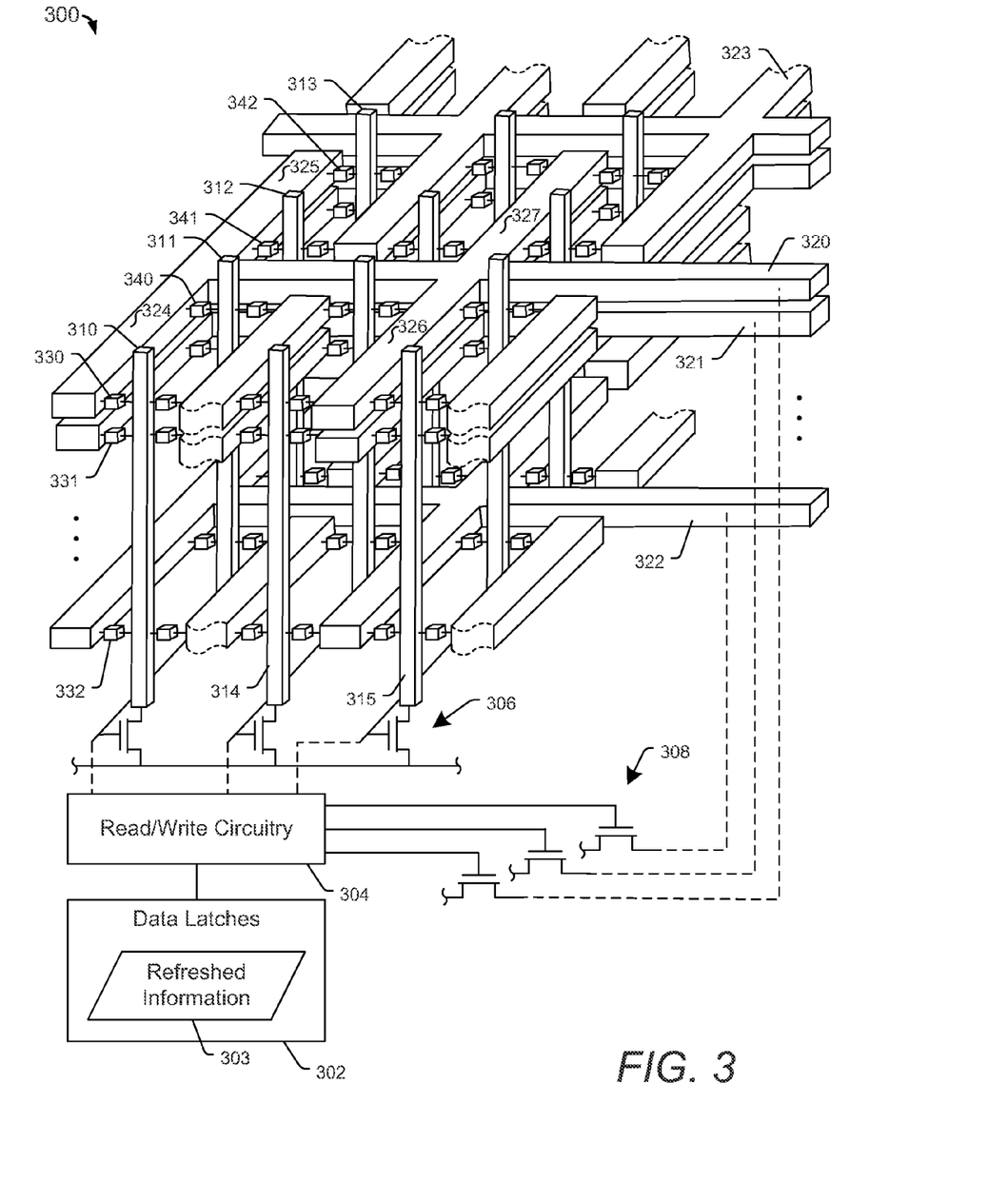
FIG. 3 is a diagram of a portion of an illustrative embodiment of a memory die that may be included in the data storage device of FIG. 1.

FIG. 3 is a diagram that illustrates a portion of a particular embodiment of a memory die 300 in a ReRAM configuration. The memory die 300 may be included in the data storage device 102 of FIG. 1. For example, the memory die 300 may correspond to the memory die 103 of FIG. 1. The memory die 300 may be coupled to the controller 130 of FIG. 1.

The memory die 300 may include data latches 302 and read/write circuitry 304. The read/write circuitry 304 may correspond to the read/write circuitry 114 of FIG. 1, and the data latches 302 may correspond to the data latches 116 of FIG. 1. The read/write circuitry 304 is coupled to bit line drivers 306 and to word line drivers 308.

In the embodiment illustrated in FIG. 3, the memory die 300 includes a vertical bit line ReRAM with a plurality of conductive lines in physical layers over a substrate (e.g., substantially parallel to a surface of the substrate), such as representative word lines 320, 321, 322, and 323 (only a portion of which is shown in FIG. 3) and a plurality of vertical conductive lines through the physical layers, such as representative bit lines 310, 311, 312, and 313. The word line 322 may include or correspond to a first group of physical layers, and the word lines 320, 321 may include or correspond to a second group of physical layers.

The memory die 300 also includes a plurality of resistance-based storage elements (e.g., memory cells), such as representative storage elements 330, 331, 332, 340, 341, and 342. Each of the storage elements 330, 331, 332, 340, 341, and 342 is coupled to (or is associated with) a bit line and a word line in arrays of memory cells in multiple physical layers over the substrate (e.g., a silicon substrate).

In the embodiment illustrated in FIG. 3, each of the word lines includes a plurality of fingers (e.g., a first word line 320 includes fingers 324, 325, 326, and 327). Each finger may be coupled to more than one bit line. To illustrate, a first finger 324 of the first word line 320 is coupled to the first bit line 310 via a first storage element 330 at a first end of the first finger 324 and is coupled to the second bit line 311 via a second storage element 340 at a second end of the first finger 324.

In the embodiment illustrated in FIG. 3, each bit line may be coupled to more than one word line. To illustrate, the first bit line 310 is coupled to the first word line 320 via the first storage element 330 and is coupled to the third word line 322 via a third storage element 332.

The first portion 106 and the second portion 110 of FIG. 1 may correspond to storage elements associated with an adjacent pair of the word lines 320, 321, 322, and 323. To illustrate, the portions 106, 110 may correspond to storage elements associated with the word lines 320, 321, or the word lines 320, 323, as illustrative examples. To further illustrate, the first portion 106 may include the storage element 330, and the second portion 110 may include the storage element 340. The storage elements 330, 340 both correspond to the word line 320.

The first portion 106 and the second portion 110 of FIG. 1 may correspond to storage elements associated with an adjacent pair of the bit lines 310, 311, 312, and 313. To illustrate, the portions 106, 110 may correspond to storage elements associated with the bit lines 310, 311, the bit lines 311, 312, or the bit lines 312, 313, as illustrative examples. To further illustrate, the first portion 106 may include the storage element 330, and the second portion 110 may include the storage element 331. The storage elements 330, 331 both correspond to the bit line 310.

As used herein, two storage elements may be "adjacent" if they are associated with a common word line or with a common bit line. The two storage elements may be adjacent even if another storage element is positioned between the two storage elements. To illustrate, the storage elements 330, 332 may be adjacent. As another illustrative example, the storage elements 330, 342 may be adjacent.

It is also noted that adjacent storage elements may be located in adjacent physical levels or in non-adjacent physical levels. For example, storage elements of the portion 106 may be included in a kth physical level of the memory die 300, and storage elements of the portion 110 may be included in a nth physical level of the memory die 300, where k is a positive integer indicating a physical level index value (e.g., a word line index value), and where n is a positive integer indicating another physical level index value. In this example, if k=0 and n=1, then the portions 106, 110 may be located in adjacent physical levels. If k=0 and n>1, then the portions 106, 110 may be located in non-adjacent physical levels. Thus, the first portion 106 and the second portion 110 may be included in adjacent or non-adjacent physical levels of the memory 104.

During a write operation, the controller 130 of FIG. 1 may receive data from a host device, such as the host device 154 of FIG. 1. The controller 130 may send the data (or a representation of the data) to the memory die 300. For example, the controller 130 may encode the data prior to sending the encoded data to the memory die 300. The data (or the representation of the data) may be latched into the data latches 302.

The read/write circuitry 304 may write the data to storage elements corresponding to the destination of the data. For example, the read/write circuitry 304 may apply selection signals to selection control lines coupled to the word line drivers 308 and the bit line drivers 306 to cause a write voltage to be applied across a selected storage element. For example, to select the first storage element 330, the read/write circuitry 304 may activate the word line drivers 308 and the bit line drivers 306 to drive a programming current (also referred to as a write current) through the first storage element 330. To illustrate, a first write current may be used to write a first logical value (e.g., a value corresponding to a high-resistance state) to the first storage element 330, and a second write current may be used to write a second logical value (e.g., a value corresponding to a low-resistance state) to the first storage element 330. The programming current may be applied by generating a programming voltage across the first storage element 330 by applying a first voltage to the first bit line 310 and to word lines other than the first word line 320 and by applying a second voltage to the first word line 320. In a particular embodiment, the first voltage is applied to other bit lines (e.g., the bit lines 314, 315) to reduce leakage current in the memory die 300.

During a read operation, the controller 130 may receive a request from a host device, such as the host device 154 of FIG. 1. The controller 130 may issue a command (e.g., the command 120) to cause the read/write circuitry 304 to read bits from particular storage elements of the memory die 300, such as by applying selection signals to selection control lines coupled to the word line drivers 308 and the bit line drivers 306 to cause a read voltage to be applied across a selected storage element. For example, to select the first storage element 330, the read/write circuitry 304 may activate the word line drivers 308 and the bit line drivers 306 to apply a first voltage (e.g., 0.7 volts (V)) to the first bit line 310 and to word lines other than the first word line 320. A lower voltage (e.g., 0 V) may be applied to the first word line 320. Thus, a read voltage is applied across the first storage element 330, and a read current corresponding to the read voltage may be detected at a sense amplifier of the read/write circuitry 304. The read current corresponds (via Ohm's law) to a resistance state of the first storage element 330, which corresponds to a logical value stored at the first storage element 330. The logical value read from the first storage element 330 and other elements read during the read operation may be provided to the controller 130 of FIG. 1 (e.g., via the data latches 302).

In a particular embodiment, the logical value is provided in connection with a read operation to the first portion 106 of FIG. 1, which may cause the controller 130 to initiate a disturb detection process (or to determine whether to initiate a disturb detection process) at the second portion 110. For example, a read operation to the first portion 106 may cause the controller 130 of FIG. 1 to generate the number 140 (or another number) using the PRNG 138 and to compare the number 140 to the threshold associated with the indication 136 to determine whether to initiate the disturb detection process. If the controller 130 initiates the disturb detection process, the memory die 300 may receive the command 122 of FIG. 1 from the controller 130. The memory die 300 may sense the information 112 in response to the command 122 to generate the sensed information 142 and may provide the sensed information 142 to the controller 130 (e.g., using the read/write circuitry 304 and the data latches 302).

In response to providing the sensed information 142 to the controller 130, the memory die 300 may receive a command from the controller 130. The command may indicate that information is to be refreshed in response to detecting an indication of a disturb condition based on the sensed information 142. To illustrate, the command may correspond to the command 124 of FIG. 1, and the command 124 may include refreshed information 303. The refreshed information 303 may include one or more values to be written to one of the storage elements 330, 331, 332, 340, 341, and 342, as illustrative examples.

Figure 4:
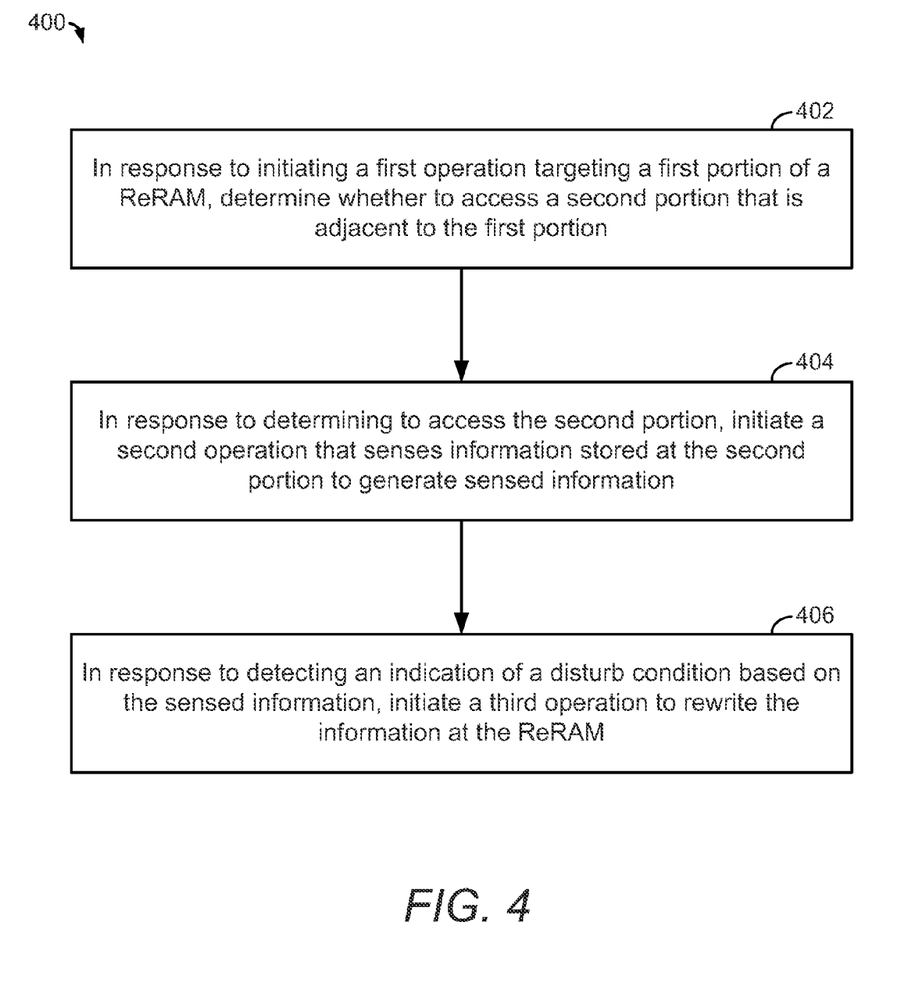
FIG. 4 is a flow diagram of an illustrative method of operation of the data storage device of FIG. 1.

Referring to FIG. 4, an illustrative example of a method is depicted and generally designated 400. The method 400 may be performed at a data storage device (e.g., the data storage device 102) that includes a memory die (e.g., the memory die 103). As an example, the memory die may include a resistive random access memory (ReRAM) (e.g., the memory 104). The ReRAM may include a first portion (e.g., the first portion 106) and a second portion (e.g., the second portion 110) that is adjacent to the first portion. Although the example of FIG. 4 is described with reference to a ReRAM (e.g., a 3D VBL ReRAM), it should be appreciated that one or more operations of the method 400 may be applicable to other memory types (e.g., another 3D memory type, such as a non-VBL 3D ReRAM).

The method 400 may include determining whether to access the second portion of the ReRAM in response to initiating a first operation targeting the first portion of the ReRAM, at 402. For example, the controller 130 of FIG. 1 may determine whether to access the second portion 110 in response to programming or sensing the information 108 at the first portion 106. In this case, the first operation may correspond to a write operation to the first portion 106 or a sense operation to the first portion 106. In a particular embodiment, the controller 130 initiates the first operation by issuing the command 120 to the memory die 103.

The first operation may access a first storage element that is included in the first portion, where the first storage element is associated with a word line of the ReRAM and is further associated with a bit line of the ReRAM. To illustrate, the first storage element may correspond to the storage element 330 of FIG. 3, the word line may correspond to the word line 320, and the bit line may correspond to the bit line 310. In this example, the storage element 330 is associated with the word line 320 and is further associated with the bit line 310.

In at least one example, the second portion includes a second storage element that is associated with the word line, and the second storage element is unselected by the first operation. To illustrate, the first operation may program the storage element 330 without programming (and without selecting) the storage element 340. The second storage element may correspond to the storage element 340. The storage elements 330, 340 both correspond to the word line 320.

In another example, the second storage element is associated with the bit line, and the second storage element is unselected by the first operation. To illustrate, the first operation may program the storage element 330 without programming (and without selecting) the storage element 331. The second storage element may correspond to the storage element 331. The storage elements 330, 331 both correspond to the bit line 310.

In a particular illustrative embodiment, determining whether to access the second portion includes generating a number (e.g., the number 140) and determining whether the number satisfies a threshold (e.g., the threshold associated with the indication 136). In this example, the second portion 110 may be accessed in response to determining that the number 140 satisfies the threshold. The number 140 may be generated pseudo-randomly (e.g., by the PRNG 138) with a particular probability (e.g., p) of satisfying the threshold. Depending on the particular application, the PRNG 138 may be implemented using hardware, such as a deterministic random bit generator (DRBG) circuit configured to generate a random or pseudo-random value based on a seed value provided by the controller 130, or the PRNG 138 may be implemented using a processor that executes instructions to determine a random or pseudo-random value (e.g., using a firmware routine or subroutine that the controller 130 initiates to determine a random or pseudo-random value).

The method 400 may optionally include detecting the disturb condition by comparing statistical distribution information associated with the sensed information to reference distribution information. For example, the statistical distribution information may correspond to the statistical distribution information 144, and the reference distribution information may correspond to the reference distribution information 146. In a particular embodiment, the statistical distribution information 144 is based on a statistical distribution of resistance states determined by decoding one or more ECC codewords retrieved from the memory 104. The one or more ECC codewords may correspond to the information 112 of FIG. 1. The disturb condition may include one or more of a read disturb condition at the second portion caused by one or more read operations targeting the first portion or a write disturb condition at the second portion caused by one or more write operations targeting the first portion.

Comparing the statistical distribution information to the reference distribution information may include comparing a height associated with the statistical distribution information (e.g., the height H1) to a reference height associated with the reference distribution information (e.g., the reference height H2). Alternatively or in addition, comparing the statistical distribution information to the reference distribution information may include comparing a width (e.g., the width W1) associated with the statistical distribution information to a reference width associated with the reference distribution information (e.g., the reference width W2).

The method 400 may further include initiating a second operation that senses information stored at the second portion to generate sensed information in response to determining to access the second portion, at 404. For example, the information may correspond to the information 112, and the sensed information may correspond to the sensed information 142. The controller 130 may initiate the second operation by issuing the command 122 to the memory die 103, as an illustrative example.

The method 400 may further include initiating a third operation to rewrite the information at the ReRAM in response to detecting an indication of a disturb condition based on the sensed information, at 404. The controller 130 may initiate the third operation by issuing the command 124 to the memory die 103, as an illustrative example. The indication of the disturb condition may correspond to a difference between one or more states of the sensed information 142 and one or more reference states (e.g., a difference between the height H1 and the reference height H2 of FIG. 2 and/or a difference between the width W1 and the reference width W2 of FIG. 2, as illustrative examples).

The method 400 may be performed by the controller 130 of FIG. 1. For example, the controller 130 may initiate the first operation, the second operation, and the third operation. In a particular embodiment, the ReRAM has a 3D memory configuration (e.g., a 3D VBL configuration). To illustrate, the 3D memory configuration may be monolithically formed in one or more physical levels of arrays of memory cells having an active area above a silicon substrate, and the memory die may further include circuitry associated with operation of the memory cells, such as the any of the read/write circuitry 114, the data latches 116, the data latches 302, or the read/write circuitry 304, as illustrative examples.

The method 400 may enable detection of disturb conditions at a memory, which may be particularly advantageous at a memory having a 3D memory configuration. For example, because a 3D memory configuration may include more pairs of adjacent storage elements as compared to a planar memory configuration, disturb conditions may occur more frequently. Further, certain techniques used by planar memory devices may be inadequate for disturb detection in a 3D memory. For example, sensing storage elements of adjacent word lines may be insufficient to detect certain disturb conditions in a VBL ReRAM architecture in which adjacent bit lines may also be subject to read disturb and/or write disturb. Hence, the method 400 may enable improved reliability of data stored at a memory, such as a memory having a 3D memory configuration.

Although certain examples have been provided for illustration, it should be appreciated that certain modifications or substitutions may be made to such examples without departing from the scope of the disclosure. For example, certain examples have been described with reference to pseudo-random number generation (e.g., pseudo-randomly generating the number 140 by the PRNG 138 of FIG. 1). In other implementations, a counter may be incremented in response to operations (e.g., in response to read operations and write operations). In this case, when a value of the counter satisfies a threshold value (e.g., 100, or another number), the controller 130 may check for a disturb condition at one or more portions of the memory 104 (e.g., at the second portion 110).

It is also noted that certain characteristics of the data storage device 102 may be modified (e.g., updated) using a firmware update or other update. To illustrate, as the data storage device 102 is operated, physical characteristics of the data storage device 102 may change (e.g., storage elements of the memory 104 may undergo physical degradation or wear). In this case, the reference distribution information 146 may be modified (e.g., via a firmware update) so that the reference distributions 206, 208 indicate flatter and wider distributions of states due to the physical wear. Alternatively or in addition, the probability p may be adjusted (e.g., via a firmware update). To illustrate, as physical wear occurs at the memory 104, the probability p may be increased to enable a greater number of disturb detection operations.

In a particular illustrative embodiment, instead of using the widths illustrated in FIG. 2, the controller 130 is configured to determine standard deviations (or variances) of the distributions 202, 204 using a Gaussian statistical model, such as a Gaussian mixture model (GMM). In this example, the controller 130 may be configured to compare a standard deviation associated with the distribution 202 to a reference standard deviation of the reference distribution 206 and to compare a standard deviation associated with the distribution 204 to a reference standard deviation of the reference distribution 208. The standard deviation (or variance) can be computed by the controller 130 by "fitting" states to a Gaussian distribution.

Although the controller 130 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein (e.g., the comparator 134 and/or the PRNG 138) may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform operations described herein, such as one or more operations of the method 400 of FIG. 4. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM).

To further illustrate, the controller 130 may include a processor that is configured to execute instructions to perform certain operations described herein. The processor may include an execution unit operable to execute the instructions. The processor may execute the instructions to determine whether to access the second portion 110. For example, the processor may execute one or more instructions to pseudo-randomly generate the number 140 and to compare the number 140 to the threshold associated with the indication 136. The processor may further execute the instructions to initiate a second operation that senses the information 112 stored at the second portion 110 to generate the sensed information 142. For example, the processor may execute one or more instructions to issue the command 122. The processor may further execute the instructions to initiate a third operation to rewrite the information 112. For example, the processor may execute one or more instructions to issue the command 124. In one or more implementations, the processor may access a pseudo-random number generator (e.g., the PRNG 138) that is external to the processor to generate a number (e.g., the number 140).

It should be appreciated that one or more operations described herein as being performed by the controller 130 may be performed at the memory 104. As an illustrative example, "in-memory" ECC operations may be performed at the memory die 103 alternatively or in addition to performing such operations at the controller 130.

The data storage device 102 may be attached to or embedded within one or more host devices, such as within a housing of a host communication device (e.g., the host device 154). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external devices, such as the host device 154.

To further illustrate, the data storage device 102 may be configured to be coupled to the host device 154 as embedded memory, such as in connection with an embedded Multi-Media Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
at a data storage device that includes a memory die, wherein the memory die includes a resistive random access memory (ReRAM), performing:
in response to initiating a first operation targeting a first portion of the ReRAM, determining whether to access a second portion of the ReRAM, wherein the second portion is adjacent to the first portion;
in response to determining to access the second portion, initiating a second operation that senses information stored at the second portion to generate sensed information; and
in response to detecting an indication of a disturb condition by comparing a distribution of memory states of the second portion based on the sensed information to reference distribution information, initiating a third operation to rewrite the information at the ReRAM.

2. The method of claim 1, wherein the first operation corresponds to a write operation to the first portion of the ReRAM or a sense operation to the first portion of the ReRAM.

3. The method of claim 1, wherein the first operation accesses a first storage element that is included in the first portion of the ReRAM, and wherein the first storage element is associated with a word line of the ReRAM and is further associated with a bit line of the ReRAM.

4. The method of claim 3, wherein the second portion of the ReRAM includes a second storage element that is associated with the word line, and wherein the second storage element is unselected by the first operation.

5. The method of claim 3, wherein the second portion of the ReRAM includes a second storage element that is associated with the bit line, and wherein the second storage element is unselected by the first operation.

6. The method of claim 1, wherein determining whether to access the second portion includes generating a number and determining whether the number satisfies a threshold, wherein the second portion of the ReRAM is accessed in response to determining that the number satisfies the threshold, and wherein the number is generated pseudo-randomly with a particular probability of satisfying the threshold.

7. The method of claim 1, further comprising detecting the disturb condition by comparing a first histogram that corresponds to the distribution of memory states and that is associated with the sensed information to a second histogram associated with the reference distribution information.

8. The method of claim 7, wherein comparing the distribution of memory states to the reference distribution information includes comparing a height associated with the first histogram to a reference height associated with the second histogram.

9. The method of claim 7, wherein comparing the distribution of memory states to the reference distribution information includes comparing a width associated the with first histogram to a reference width associated with the second histogram.

10. The method of claim 1, wherein the ReRAM has a three-dimensional (3D) memory configuration.

11. The method of claim 10, wherein the 3D memory configuration is monolithically formed in one or more physical levels of arrays of memory cells having an active area above a silicon substrate, and wherein the memory die further includes circuitry associated with operation of the memory cells.

12. A data storage device comprising:
a memory die, wherein the memory die includes a resistive random access memory (ReRAM), wherein the ReRAM includes a first portion and a second portion, and wherein the second portion is adjacent to the first portion; and
a controller, wherein the controller is coupled to the memory die, wherein the controller is configured to determine whether to access the second portion of the ReRAM in response to initiating a first operation targeting the first portion of the ReRAM, wherein the controller is further configured to initiate a second operation that senses information stored at the second portion to generate sensed information in response to determining to access the second portion, and wherein the controller is further configured to initiate a third operation to rewrite the information at the ReRAM in response to detecting an indication of a disturb condition by comparing a first histogram that is associated with the second portion and that is based on the sensed information to a second histogram associated with reference distribution information.

13. The data storage device of claim 12, wherein the controller includes:
a pseudo-random number generator (PRNG) configured to generate a number pseudo-randomly; and
a comparator configured to determine whether the number satisfies a threshold,
wherein the controller is further configured to access the second portion of the ReRAM in response to the number satisfying the threshold.

14. The data storage device of claim 12, wherein the memory die further includes read/write circuitry, and wherein the read/write circuitry is configured to generate the sensed information using a soft read technique.

15. The data storage device of claim 12, wherein the ReRAM has a vertical bit line (VBL) architecture, and wherein the first portion and the second portion are included in non-adjacent physical levels of the memory.

16. The data storage device of claim 12 wherein the ReRAM has a three-dimensional (3D) memory configuration.

17. The data storage device of claim 16, wherein the 3D memory configuration is monolithically formed in one or more physical levels of arrays of memory cells having an active area above a silicon substrate, and wherein the memory die further includes circuitry associated with operation of the memory cells.

18. The data storage device of claim 12, wherein the controller is further configured to identify the second portion by determining a second address associated with the second portion by adjusting a value of a first address associated with the first portion.

19. An apparatus comprising:
means for storing first data and for indicating values of the first data using a resistive data storage technique;
means for storing second data and for indicating values of the second data using the resistive data storage technique, the means for storing second data adjacent to the means for storing first data; and
means for determining whether to access the means for storing second data in response to initiating a first operation targeting the means for storing first data, for initiating a second operation that senses information stored at the means for storing second data to generate sensed information in response to determining to access the means for storing second data, for detecting an indication of a disturb condition by comparing a distribution of memory states of the means for storing second data based on the sensed information to reference distribution information, and for initiating a third operation to rewrite the information in response to detecting the indication.

20. The apparatus of claim 19, wherein the means for determining is configured to identify the means for storing second data during performance of the first operation.

* * * * *